(12) United States Patent
Mita

(10) Patent No.: US 7,213,333 B2
(45) Date of Patent: May 8, 2007

(54) METHOD FOR MANUFACTURING MOUNTING SUBSTRATE AND METHOD FOR MANUFACTURING CIRCUIT DEVICE

(75) Inventor: Kiyoshi Mita, Gunma (JP)

(73) Assignees: Sanyo Electric Co., Ltd., Osaka (JP); Kanto Sanyo Semiconductors Co., Ltd., Gunman (JP)

( * ) Notice: Subject to any disclaimer, the term of this patent is extended or adjusted under 35 U.S.C. 154(b) by 121 days.

(21) Appl. No.: 10/813,778

(22) Filed: Mar. 31, 2004

(65) Prior Publication Data

US 2004/0226828 A1 Nov. 18, 2004

(30) Foreign Application Priority Data

Apr. 11, 2003 (JP) .......................... P.2003-107753

(51) Int. Cl.
*H01K 3/10* (2006.01)
*H05K 3/02* (2006.01)

(52) U.S. Cl. ............................ 29/847; 29/850; 29/853; 438/460; 205/125

(58) Field of Classification Search ................ 205/122, 205/125; 29/825, 829, 847, 850, 853; 438/460
See application file for complete search history.

(56) References Cited

U.S. PATENT DOCUMENTS 5,042,147 A * 8/1991 Tashiro ........................ 29/847
6,904,674 B2 * 6/2005 Mune et al. .................. 29/852
2004/0164385 A1 * 8/2004 Kado et al. .................. 257/678

* cited by examiner

Primary Examiner—Nam Nguyen
Assistant Examiner—Luan V. Van
(74) Attorney, Agent, or Firm—Fish & Richardson P.C.

(57) ABSTRACT

Provided are a method for manufacturing a mounting substrate and a method for manufacturing a circuit device, both of which include the step of electroplating a number of electrodes. The method for manufacturing a mounting substrate includes the steps of: forming a plurality of electrodes to a mounting substrate, the plurality of electrodes being electrically connected to each other by use of plating wires; energizing the electrodes via the plating wires to coat the electrodes with plated films 19 by electroplating; and electrically separating the individual electrodes from each other by cutting off the plating wires. Furthermore, the method for manufacturing a circuit device includes, in addition to the foregoing method for manufacturing a mounting substrate, the steps of: fixing a circuit element on the mounting substrate and electrically connecting the electrodes with the circuit element; and forming a sealing resin so as to cover the circuit element.

16 Claims, 6 Drawing Sheets

METHOD FOR MANUFACTURING MOUNTING SUBSTRATE AND METHOD FOR MANUFACTURING CIRCUIT DEVICE

BACKGROUND OF THE INVENTION

1. Field of the Invention

The present invention relates to a method for manufacturing a mounting substrate and a method for manufacturing a circuit device, which include electroplating of a number of electrodes.

2. Description of the Related Art

Along with high integration of semiconductor elements, there has been a rapid increase in the number of pins of a circuit device including semiconductor elements mounted thereon. As countermeasures to realize an integrated circuit package with an increased number of pins, an external lead pitch has been reduced from 0.65 mm to about 0.5 mm in a conventional circuit device. Meanwhile, as the semiconductor elements have become highly integrated and multifunctional, a package of semiconductor elements of about 500 to 1000 pins has been desired.

Moreover, in order to protect a metal portion of a substrate for electronic components or to facilitate joining with other electronic components, partial plating has been conventionally performed for specific spots of the metal portion. There are various kinds of such plating. Here, as typical plating, wet electroplating and electroless plating can be enumerated. Generally, a stronger plated film can be formed by the electroplating than the electroless plating. In order to perform the electroplating, it is required to energize a member to be plated.

With reference to FIGS. 7A and 7B, description will be given of a conventional mounting substrate and a circuit device. FIG. 7A is a cross-sectional view of a circuit device 100, and FIG. 7B is a back view of FIG. 7A.

With reference to FIG. 7A, electrodes 104 made of copper foil or the like are formed on an upper surface of a mounting substrate 101 made of glass epoxy or the like. On a back of the mounting substrate 101, back face electrodes 105 are formed, which are connected to the electrodes 104 through via holes 106. Moreover, each of the electrodes 104 and the back face electrodes 105 is covered with a plated film 109. Here, in consideration of bonding properties of the electrodes 104 that are bonding pads, the plated film 109 is formed by electroplating.

A circuit element 102 that is a semiconductor element is fixed on the mounting substrate 101 and is connected to the electrodes 104 by use of metal thin wires 103. Moreover, a sealing resin 107 is formed so as to cover the circuit element 102.

With reference to FIG. 7B, on the back of the mounting substrate 101, the back face electrodes 105 are arranged in two rows parallel to a peripheral part of the mounting substrate 101. In order to perform the electroplating, the back face electrodes 105 are connected to the outside through plating wires 108. Moreover, the inner back face electrodes 105 are connected to the plating wires 108 which are drawn between the outer back face electrodes 105 to the outside. Accordingly, the back face electrodes 105 and the electrodes 104 are electroplated by energizing the back face electrodes 105 and the electrodes 104 via the plating wires 108.

However, in the foregoing circuit device 100, the plating wires 108 are drawn out between the outer back face electrodes 105. Therefore, when intervals between the back face electrodes 105 are, for example, about 0.5 mm, only one plating wire 108 can extend between the back face electrodes 105. Consequently, there was a problem that the back face electrodes 105 cannot be arranged in three rows or more.

SUMMARY OF THE INVENTION

The present invention was made in consideration for the foregoing problems. The main object of the present invention is to provide a method for manufacturing a mounting substrate including a number of electroplated external electrodes and a method for manufacturing a circuit device including the same.

A method for manufacturing a mounting substrate according to the present invention includes: forming a plurality of electrodes on a mounting substrate, the plurality of electrodes being electrically connected to each other by use of plating wires; energizing the electrodes via the plating wires to coat the electrodes with plated films by electroplating; and electrically separating the individual electrodes from each other by cutting off the plating wires.

Another method for manufacturing a mounting substrate according to the present invention includes: providing electrodes which are arranged in not less than two rows to surround a circuit element disposed in the vicinity of a center part of a mounting substrate and connecting the adjacent electrodes to each other by use of plating wires; energizing the electrodes via the plating wires to coat the electrodes with plated films by electroplating; and electrically separating the individual electrodes from each other by cutting off the plating wires.

A method for manufacturing a circuit device according to the present invention includes: forming a plurality of electrodes on a mounting substrate, the plurality of electrodes being electrically connected to each other by use of plating wires; energizing the electrodes via the plating wires to coat the electrodes with plated films by electroplating; electrically separating the individual electrodes from each other by cutting off the plating wires; fixing a circuit element on the mounting substrate and electrically connecting the electrodes to the circuit element; and forming a sealing resin to cover the circuit element.

Another method for manufacturing a circuit device according to the present invention includes: providing electrodes which are arranged in not less than two rows to surround a circuit element disposed in the vicinity of a center part of a mounting substrate and connecting the adjacent electrodes to each other by use of plating wires; energizing the electrodes via the plating wires to coat the electrodes with plated films by electroplating; electrically separating the individual electrodes from each other by cutting off the plating wires; fixing a circuit element on the mounting substrate and electrically connecting the electrodes to the circuit element; and forming a sealing resin to cover the circuit element.

DESCRIPTION OF THE EMBODIMENTS

Figure 1A:
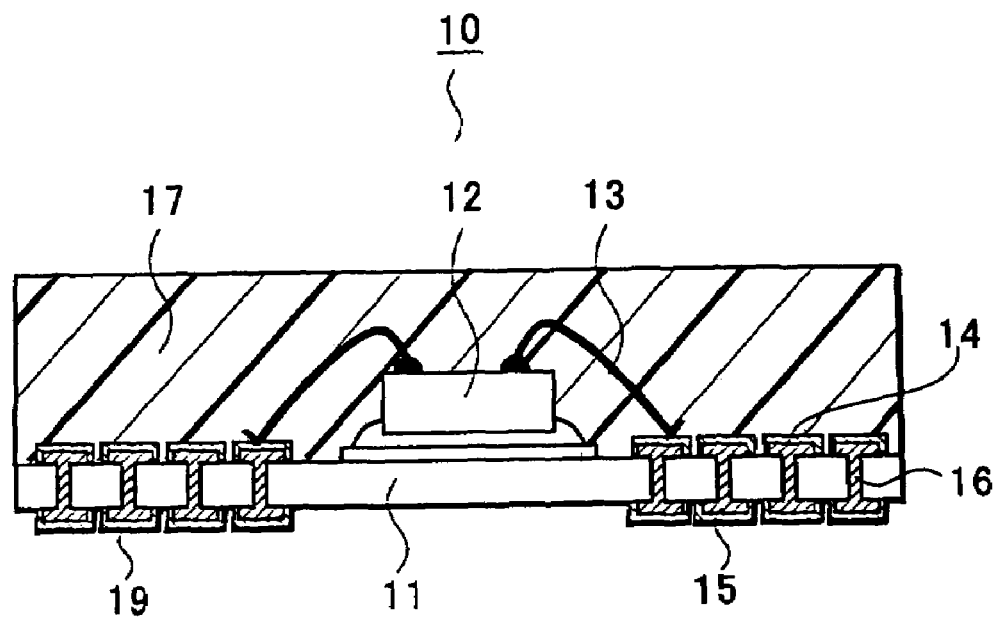
FIGS. 1A and 1B are respectively a cross-sectional view and a back view of a mounting substrate and a circuit device which are manufactured respectively by use of a method for manufacturing a mounting substrate and a method for manufacturing a circuit device according to the present embodiment.
Figure 1B:
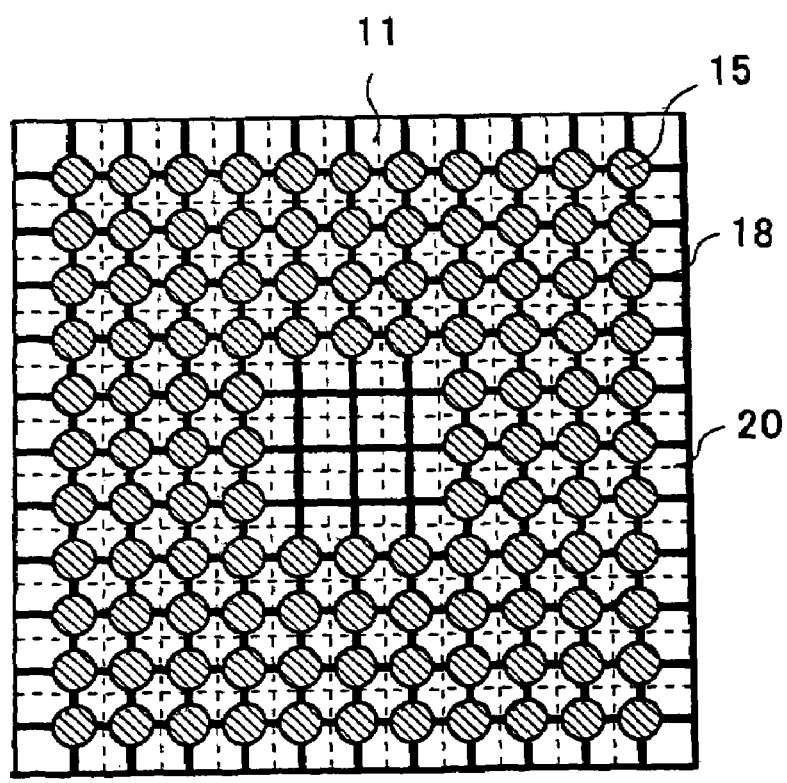

First, with reference to FIGS. 1A and 1B, description will be given of a structure of a circuit device 10 including a mounting substrate 11, which are manufactured by use of a method for manufacturing a mounting substrate and a method for manufacturing a circuit device according to the present embodiment. FIG. 1A is a cross-sectional view of the circuit device 10, and FIG. 1B is a back view thereof.

With reference to FIG. 1A, on a surface of the mounting substrate 11 made of glass epoxy or the like, at least front face electrodes 14 constituting bonding pads are formed. Furthermore, on a back of the mounting substrate 11, back face electrodes 15 are formed, which function as terminals for connection with the outside. Moreover, the front face electrodes 14 and the back face electrodes 15 are electrically connected to each other through via holes 16 which are provided so as to penetrate the mounting substrate 11. The front face electrodes 14 and the back face electrodes 15 are made of metal such as copper.

Plated films 19 cover the individual front face electrodes 14 and back face electrodes 15. Here, in order to improve bonding properties of the front face electrodes 14, the plated films 19 are deposited by electroplating. Moreover, as a material of the plated films 19, for example, Au, Ag, Pd, Ni or Cr can be adopted. Moreover, a mixture of those described above or a material obtained by laminating those described above can be also adopted as the material of the plated films 19.

A circuit element 12 is fixed to the mounting substrate 11 in the vicinity of a center part of the circuit device 10 with an adhesive. As the circuit element 12, here, a semiconductor element is adopted. The circuit element 12 is connected to the front face electrodes 14 by metal thin wires 13. Here, as the circuit element 12, other passive and active elements can be generally adopted. Furthermore, a plurality of those passive and active elements can be adopted.

A sealing resin 17 is made of thermoplastic resin or thermosetting resin and covers the circuit element 12 and the metal thin wires 13.

With reference to FIG. 1B, description will be given of a structure of the back face electrodes formed on the back of the mounting substrate 11. The mounting substrate 11 is formed in a rectangular shape when viewed from above. The back face electrodes 15 are arranged in a lattice on the back of the mounting substrate 11. Specifically, the back face electrodes 15 are arranged in four rows from the vicinity of the center part to the vicinity of a peripheral part to form a rectangular shape. Intervals between the adjacent back face electrodes 15 can be set to 0.5 mm or less.

Plating wires 18 have a function of electrically connecting the back face electrodes 15 to each other in a process of electroplating the back face electrodes 15. Therefore, after the electroplating process is finished, the plating wires 18 are cut off by dicing or the like. For example, the plating wires 18 can be cut off by performing dicing along dicing lines indicated by dotted lines in FIG. 1B.

Next, with reference to FIGS. 2A to 6, description will be given of the method for manufacturing a mounting substrate and the method for manufacturing a circuit device according to the present embodiment.

The method for manufacturing a mounting substrate 11 of the present embodiment includes the steps of: forming a plurality of electrodes on the mounting substrate 11, the plurality of electrodes being electrically connected to each other by use of plating wires 18; energizing the electrodes via the plating wires 18 to coat the electrodes with plated films 19 by electroplating; and electrically separating the individual electrodes from each other by cutting off the plating wires 18. Furthermore, the method for manufacturing a circuit device 10 of the present embodiment includes, in addition to the foregoing method for manufacturing a mounting substrate, the steps of: fixing a circuit element 12 on the mounting substrate 11 and electrically connecting the electrodes to the circuit element 12; and forming a sealing resin 17 so as to cover the circuit element 12.

Figure 2A:
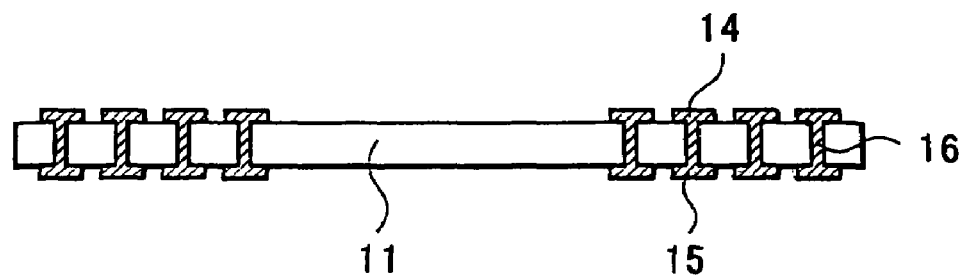
FIGS. 2A and 2B are respectively a cross-sectional view and a back view showing the method for manufacturing a mounting substrate and the method for manufacturing a circuit device according to the present embodiment.
Figure 2B:
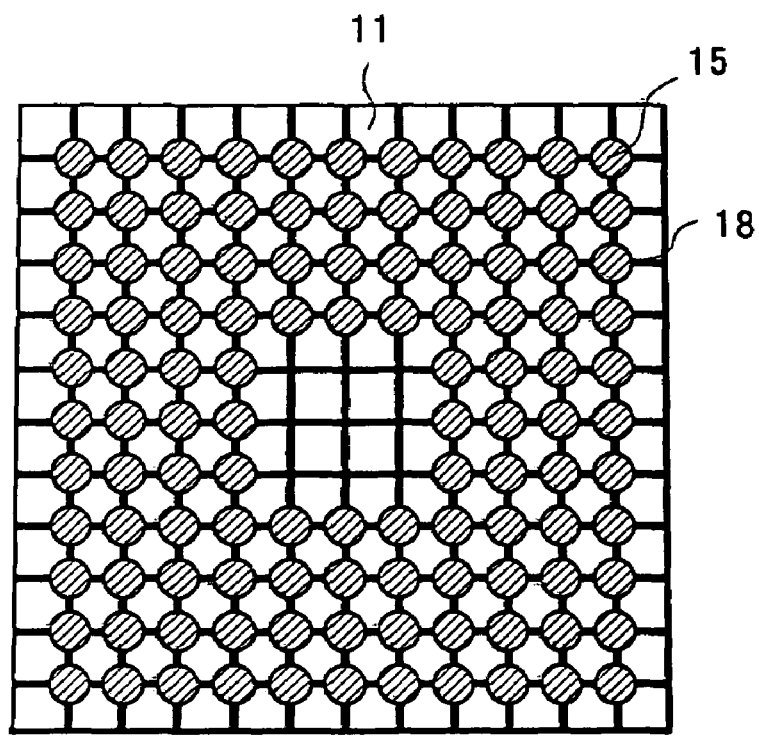
Figure 3:
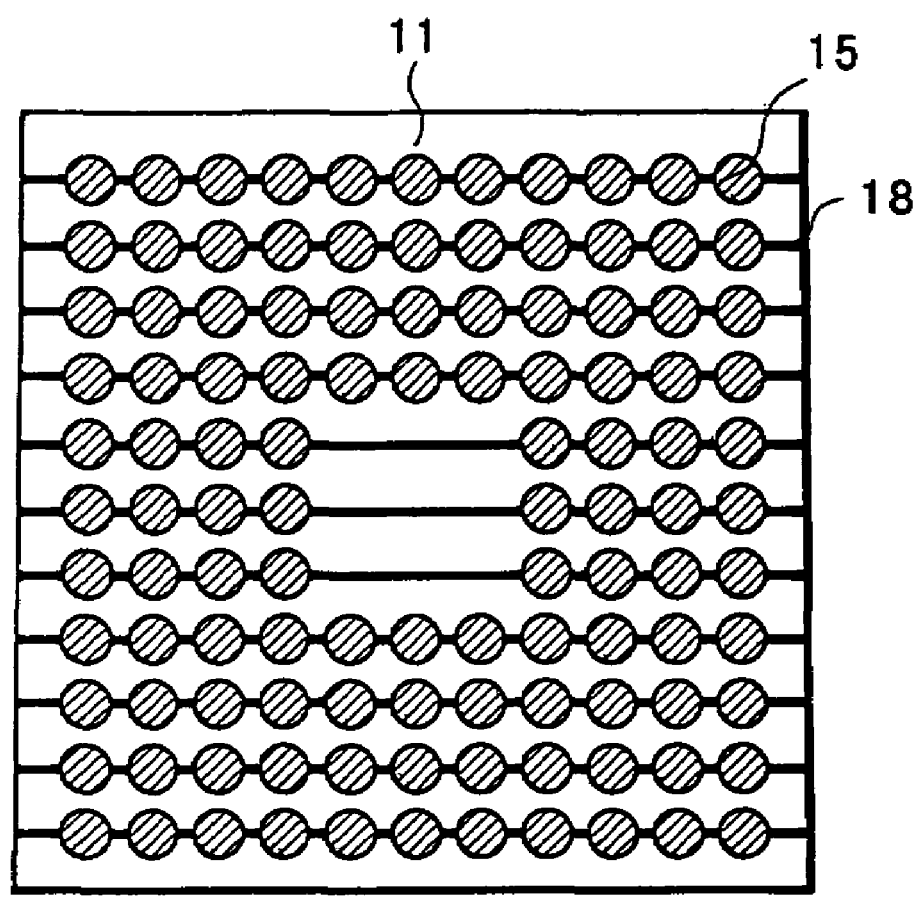
FIG. 3 is a back view showing the method for manufacturing a mounting substrate and the method for manufacturing a circuit device.

First, with reference to FIGS. 2A and 2B, the plurality of electrodes electrically connected to each other by use of the plating wires 18 are formed on the mounting substrate 11. The mounting substrate 11 is made of a material mainly containing resin such as glass epoxy, ceramics or the like. On a surface of the mounting substrate 11, front face electrodes 14 are formed, which function as bonding pads. Moreover, wiring may be formed, which extends to places of back face electrodes 15 from the respective bonding pads.

The back face electrodes 15 are provided on a back of the mounting substrate 11 and function as external terminals. The individual back face electrodes 15 are electrically connected to the front face electrodes 14 through via holes 16 which are provided so as to penetrate the mounting substrate 11.

With reference to FIG. 2B, the back face electrodes 15 will be described in detail. The back face electrodes 15 are arranged in a lattice on the back of the mounting substrate 11. Specifically, the back face electrodes 15 are arranged in four rows from the vicinity of a center part to the vicinity of a peripheral part to form a rectangular shape. Intervals between the adjacent back face electrodes 15 can be set to 0.5 mm or less. Here, the back face electrodes 15 are arranged in four rows so as to surround a circuit element to be disposed in the center part of the substrate. However, this arrangement can be arbitrarily changed.

The plating wires 18 are formed so as to connect the adjacent back face electrodes 15 to each other. The plating wires 18 can be formed of the same material as that of the back face electrodes 15. Specifically, conductive foil is attached to the back of the mounting substrate 11 and this conductive foil is selectively removed by use of a removal method such as etching. Thus, the back face electrodes 15 and the plating wires 18 can be formed simultaneously. Here, the plating wires 18 are arranged so as to connect the back face electrodes 15, which are disposed in a matrix form, to each other in vertical and horizontal directions, and all the back face electrodes 15 are connected to each other by the plating wires 18. In the conventional example, plating wires of external electrodes which are disposed in the inner circumference are drawn out between external electrodes which are disposed in the outer circumference. Thus, there is a limitation to reduction of the intervals between the external electrodes. In the present application, the inner back face electrodes 15 are connected to the outer back face electrodes 15 by the plating wires 18. Therefore, it is possible to secure electric connection of the inner back face electrodes 15 without drawing plating wires between the outer back face electrodes 15. Consequently, the intervals between the back face electrodes 15 can be reduced.

Moreover, the individual back face electrodes 15, which are connected to each other by the plating wires 18, are connected to the front face electrodes 14 through the via holes 16. Thus, all the back face electrodes 15 and front face electrodes 14 are electrically connected to each other by the plating wires 18.

In the description of FIG. 2B, the back face electrodes 15 are connected to each other in the vertical and horizontal directions by the plating wires 18. Meanwhile, here, with reference to FIG. 3, the back face electrodes 15 are connected to each other in the horizontal direction by the plating wires 18. Moreover, the back face electrodes 15 may be connected partially in the vertical direction or in an oblique direction by the plating wires 18.

Figure 4A:
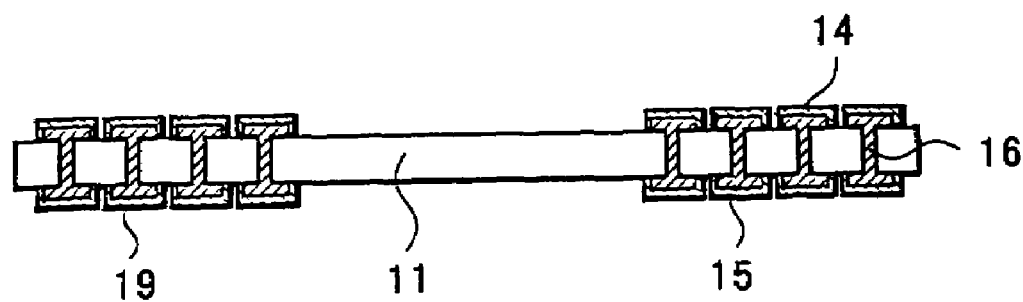
FIGS. 4A and 4B are respectively a cross-sectional view and a back view showing the method for manufacturing a mounting substrate and the method for manufacturing a circuit device according to the present embodiment.
Figure 4B:
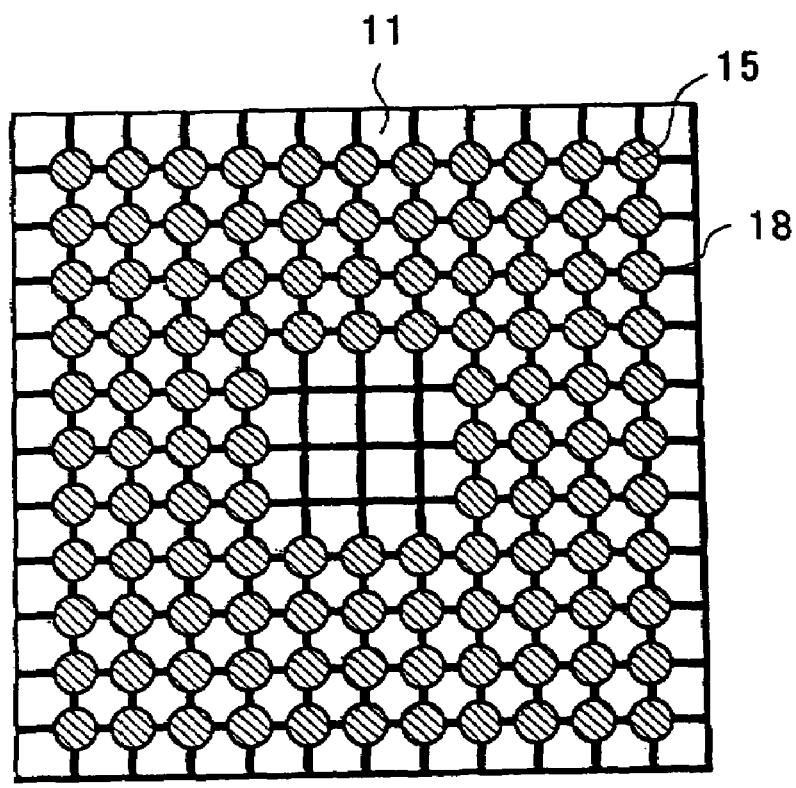

Next, with reference to FIGS. 4A and 4B, the electrodes are energized via the plating wires 18. Thus, the electrodes are coated with the plated films 19 by electroplating.

As methods of plating, there are electroplating and electroless plating. In the present embodiment, in consideration of the bonding properties of the front face electrodes 14 used as the bonding pad, coating of the plated films 19 is performed by use of the electroplating. As a material of the plated films 19, for example, Au, Ag, Pd, Ni or Cr can be adopted. Moreover, a mixture of those described above or a material obtained by laminating those described above can be also adopted as the material of the plated films 19.

As a specific method of the electroplating, first, the mounting substrate 11 described above is immersed in a plating solution. The plating solution is a solution containing ions of the metal described above. Thereafter, positive and negative electrodes are put in the solution, and a current is passed through the solution. Any one of the plating wires 18 of the mounting substrate is connected to the negative electrode. Accordingly, surfaces of the front face electrodes 14 and back face electrodes 15 are coated with the plated films 19. Moreover, the back face electrodes 15 are connected to each other by the plating wires 18. Furthermore, the back face electrodes 15 and the respective front face electrodes 14 are connected to each other through the via holes 16. Therefore, by energizing one of the plating wires 18, all the back face electrodes 15 and front face electrodes 14 can be subjected to plating processing.

Figure 5:
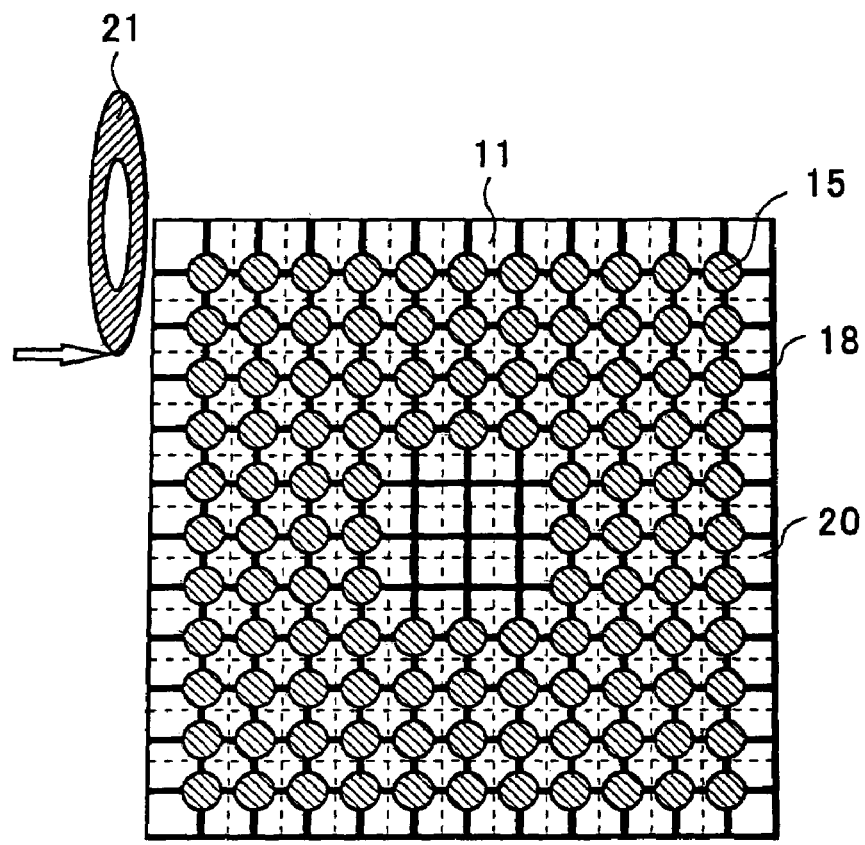
FIG. 5 is a back view explaining the method for manufacturing a mounting substrate and the method for manufacturing a circuit device according to the present embodiment.

Next, with reference to FIG. 5, the individual electrodes are electrically separated from each other by cutting off the plating wires 18.

Here, the plating wires 18 connect the back face electrodes 15 to each other in the vertical and horizontal directions. Therefore, the plating wires 18 are cut off by use of a dicing blade 21 along dicing lines 20 in spaces between rows and columns. Accordingly, the individual back face electrodes 15 are electrically separated from each other. When the plating wires 18 connect the back face electrodes 15 to each other only in the vertical direction, the back face electrodes 15 can be electrically separated from each other by performing dicing in the horizontal direction.

Figure 6:
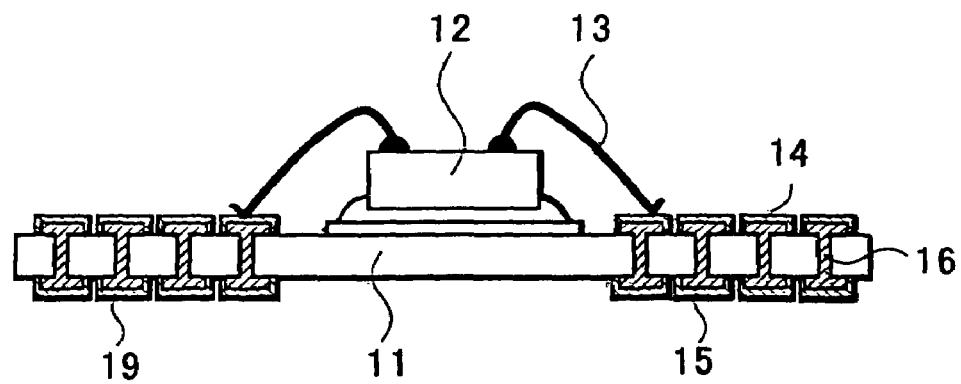
FIG. 6 is a cross-sectional view showing the method for manufacturing a mounting substrate and the method for manufacturing a circuit device according to the present embodiment.
Figure 7A:
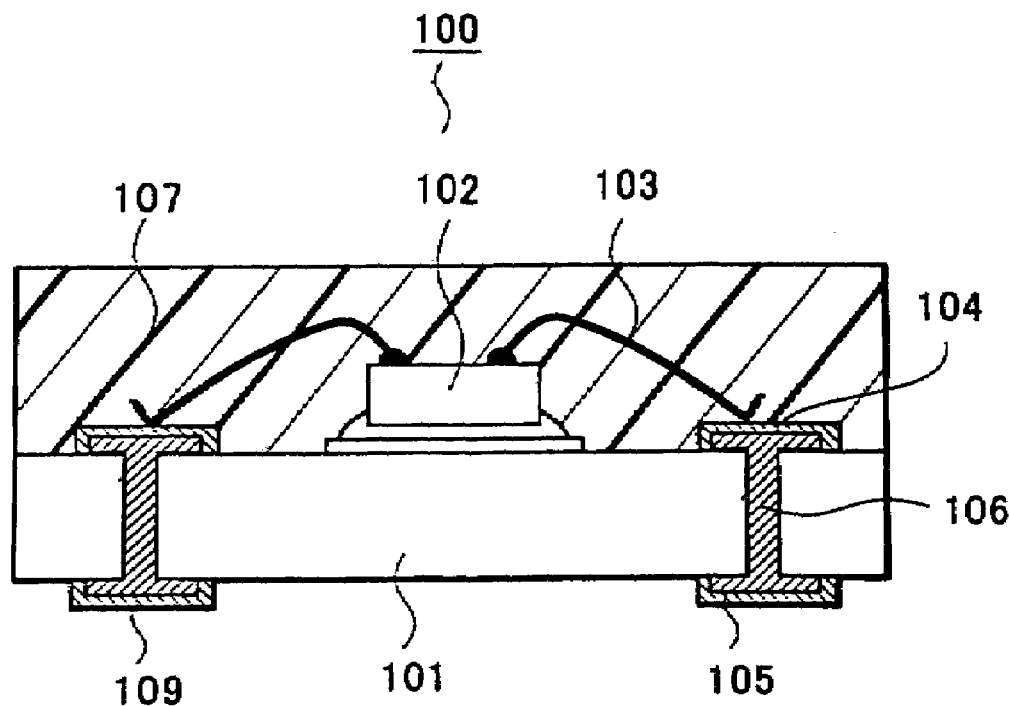
FIGS. 7A and 7B are respectively a cross-sectional view and a back view showing a conventional semiconductor device.
Figure 7B:
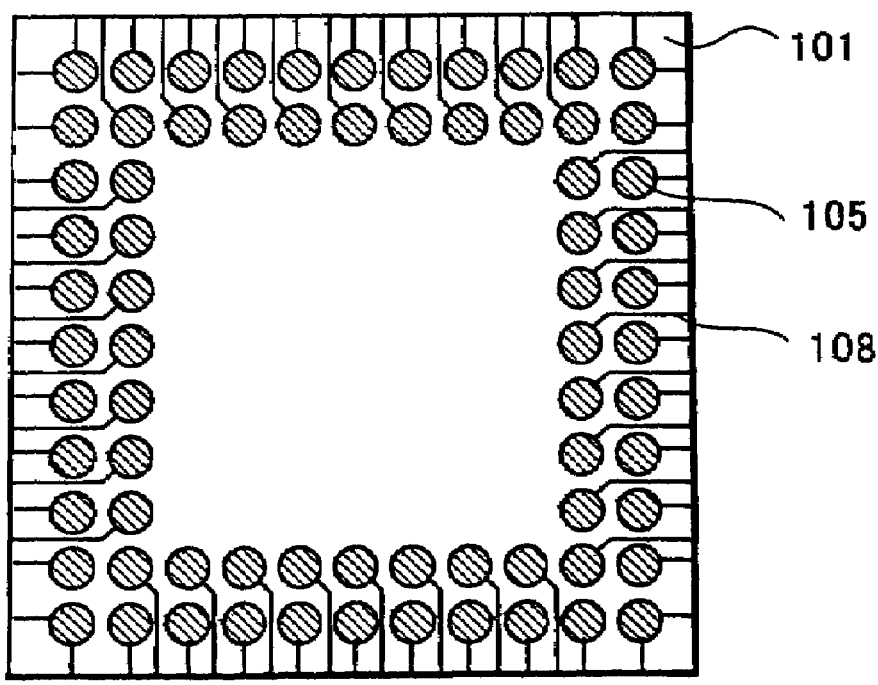

Next, with reference to FIG. 6, the circuit element 12 is fixed to the mounting substrate 11 and electrically connected to the electrodes. Thereafter, the sealing resin 17 is formed so as to cover the circuit element 12. Since the plated films 19 are attached by the electroplating as described above, good wire bonding of the metal thin wires 13 can be performed.

In the foregoing description, the method for manufacturing a mounting substrate and the method for manufacturing a circuit device according to the present embodiment have been described. However, without departing from the scope of the present embodiment, various changes can be made. Specifically, in the electroplating process, it is also possible to use a plating resist so as to form the plated films 19 only in desired spots. Moreover, it is also possible to cut off the respective plating wires 18 after the sealing resin 17 is formed.

By use of the method for manufacturing a mounting substrate and the method for manufacturing a circuit device according to the present embodiment, in the electroplating process, the adjacent back face electrodes 15 are electrically connected to each other by the plating wires 18. Thus, the intervals between the back face electrodes 15 can be reduced by eliminating the plating wires laid out between the back face electrodes 15. Therefore, even if the intervals between the back face electrodes 15 are 0.5 mm or less, the back face electrodes 15 can be arranged in three rows or more so as to surround the circuit element 12. Thus, it is possible to provide the circuit device 10 which catches up with the increase in the number of pins of the semiconductor element. Moreover, after the electroplating process is finished, the plating wires 18 are cut off by dicing or the like.

What is claimed is:

1. A method for manufacturing a mounting substrate, comprising:
    forming a plurality of electrodes which are directly electrically interconnected with each other via plating wires on a mounting substrate;
    energizing the electrodes via the plating wires to coat the electrodes with plated films by electroplating; and
    electrically separating the individual electrodes from each other by cutting off the plating wires
    wherein front face electrodes functioning as bonding pads are formed on a front surface of the mounting substrate, and back face electrodes, which are connected to the front face electrodes and function as external electrodes, are arranged on a back surface of the mounting substrate in concentric patterns and
    wherein each back face electrode of at least one of the concentric patterns is directly and electrically connected to four neighboring back face electrodes by separate respective plating wires extending from the back face electrode of the concentric pattern.

2. A method for manufacturing a mounting substrate, comprising:
    providing electrodes which are arranged in a plurality of rows to surround a circuit element disposed in the vicinity of a center part of a mounting substrate and directly electrically interconnecting the adjacent electrodes with each other by use of plating wires;
    energizing the electrodes to each other via the plating wires to coat the electrodes with plated films by electroplating; and
    electrically separating the individual electrodes from each other by cutting off the plating wires wherein front face electrodes functioning as bonding pads are formed on a front surface of the mounting substrate, and back face electrodes, which are connected to the front face electrodes and function as external electrodes, are arranged on a back surface of the mounting substrate in concentric patterns and wherein each back face electrode of at least one of the concentric patterns is directly and electrically connected to four neighboring back face electrodes by separate respective plating wires extending from the back face electrode of the concentric pattern.

3. The method of claim 1 or 2, wherein
a number of the electrodes are formed in a matrix form and the electrodes are coated with the plated films in a state where all the electrodes are electrically connected to each other by the plating wires.

4. The method of claim 1 or 2, wherein the plating wires are cut off by dicing.

5. A method for manufacturing a circuit device, comprising:

forming a plurality of electrodes on a mounting substrate, the plurality of electrodes being directly and electrically interconnected to each other by use of plating wires;

energizing the electrodes via the plating wires to coat the electrodes with plated films by electroplating;

electrically separating the individual electrodes from each other by cutting off the plating wires;

fixing a circuit element on the mounting substrate and electrically connecting the electrodes with the circuit element; and forming a sealing resin to cover the circuit element wherein front face electrodes functioning as bonding pads are formed on a front surface of the mounting substrate, and back face electrodes, which are connected to the front face electrodes and function as external electrodes, are arranged on a back surface of the mounting substrate in concentric patterns and wherein each back face electrode of at least one of the concentric patterns is directly and electrically connected to four neighboring back face electrodes by separate respective plating wires extending from the back face electrode of the concentric pattern.

6. A method for manufacturing a circuit device, comprising:

providing electrodes which are arranged in plurality of rows to surround a circuit element disposed in the vicinity of a center part of a mounting substrate and connecting the adjacent electrodes to each other by use of plating wires, and the electrodes are directly electrically interconnected with each other;

energizing the electrodes via the plating wires to coat the electrodes with plated films by electroplating;

electrically separating the individual electrodes from each other by cutting off the plating wires;

fixing a circuit element on the mounting substrate and electrically connecting the electrodes to the circuit element; and forming a sealing resin to cover the circuit element wherein front face electrodes functioning as bonding pads are formed on a front surface of the mounting substrate, and back face electrodes, which are connected to the front face electrodes and function as external electrodes, are arranged on a back surface of the mounting substrate in concentric patterns and wherein each back face electrode of at least one of the concentric patterns is directly and electrically connected to four neighboring back face electrodes by separate respective plating wires extending from the back face electrode of the concentric pattern.

7. The method of claim 5 or 6, wherein
a number of the electrodes are formed in a matrix form and the electrodes are coated with the plated films in a state where all the electrodes are electrically connected to each other by the plating wires.

8. The method of claims 5 or 6, wherein the plating wires are cut off by dicing.

9. The method of claim 1, wherein the back face electrodes are arranged in four concentric patterns.

10. The method of claim 1, wherein each of the concentric patterns respectively form a rectangular shape.

11. The method of claim 2, wherein the back face electrodes are arranged in four concentric patterns.

12. The method of claim 2, wherein each of the concentric patterns respectively form a rectangular shape.

13. The method of claim 5, wherein the back face electrodes are arranged in four concentric patterns.

14. The method of claim 5, wherein each of the concentric patterns respectively form a rectangular shape.

15. The method of claim 6, wherein the back face electrodes are arranged in four concentric patterns.

16. The method of claim 7, wherein each of the concentric patterns respectively form a rectangular shape.

* * * * *